United States Patent
Miller et al.

(10) Patent No.: US 11,198,939 B2
(45) Date of Patent: Dec. 14, 2021

(54) RECURSIVE INJECT APPARATUS FOR IMPROVED DISTRIBUTION OF GAS

(71) Applicant: Applied Materials, Inc., Santa Clara, CA (US)

(72) Inventors: Aaron Miller, Sunnyvale, CA (US); Kallol Bera, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 86 days.

(21) Appl. No.: 16/860,458

(22) Filed: Apr. 28, 2020

(65) Prior Publication Data

US 2020/0255943 A1   Aug. 13, 2020

Related U.S. Application Data

(63) Continuation of application No. 15/192,159, filed on Jun. 24, 2016, now Pat. No. 10,633,741.

(60) Provisional application No. 62/185,554, filed on Jun. 26, 2015.

(51) Int. Cl.
| | |
|---|---|
| *C23C 16/455* | (2006.01) |
| *H01L 21/67* | (2006.01) |
| *H01J 37/32* | (2006.01) |

(52) U.S. Cl.
CPC .. *C23C 16/45578* (2013.01); *C23C 16/45551* (2013.01); *C23C 16/45563* (2013.01); *C23C 16/45565* (2013.01); *H01L 21/67017* (2013.01); *H01J 37/3244* (2013.01)

(58) Field of Classification Search
None
See application file for complete search history.

(56) References Cited

U.S. PATENT DOCUMENTS

| | | | |
|---|---|---|---|
| 5,373,153 A | 12/1994 | Cumberledge et al. | |
| 5,746,875 A | 5/1998 | Maydan et al. | |
| 5,895,530 A | 4/1999 | Shrotriya et al. | |
| 6,083,321 A | 7/2000 | Lei et al. | |
| 6,481,945 B1 | 11/2002 | Hasper et al. | |
| 6,482,733 B2 | 11/2002 | Raaijmakers et al. | |
| 6,502,530 B1 | 1/2003 | Turlot et al. | |
| 6,511,539 B1 | 1/2003 | Raaijmakers | |
| 6,551,406 B2 | 4/2003 | Kilpi | |
| 6,821,563 B2 | 11/2004 | Yudovsky | |
| 7,168,447 B2 | 1/2007 | Stadel et al. | |
| 7,228,873 B2 | 6/2007 | Ku et al. | |
| 8,668,776 B2 | 3/2014 | Chen et al. | |
| 2004/0029489 A1 | 2/2004 | Tsujimura | |

(Continued)

FOREIGN PATENT DOCUMENTS

| | | |
|---|---|---|
| CN | 102601727 A | 7/2012 |
| JP | 4454621 B2 | 4/2010 |

(Continued)

OTHER PUBLICATIONS

Machine Translation of KR20050076968, 8 pages.
PCT International Search Report and Written Opinion in PCT/US2016/039257 dated Jan. 4, 2018, 8 pages.

*Primary Examiner* — Binu Thomas
(74) *Attorney, Agent, or Firm* — Servilla Whitney LLC

(57) ABSTRACT

Apparatus and methods for processing a substrate including an injector unit insert with a plurality of flow paths leading to a first plenum, each of the flow paths providing one or more of substantially the same residence time, length and/or conductance. Injector units including the injector unit inserts have increased flow uniformity.

18 Claims, 7 Drawing Sheets

(56) References Cited

U.S. PATENT DOCUMENTS

| | | |
|---|---|---|
| 2004/0134611 A1 | 7/2004 | Kato et al. |
| 2004/0206921 A1 | 10/2004 | Blonigan et al. |
| 2004/0255442 A1 | 12/2004 | McDiarmid et al. |
| 2005/0017100 A1 | 1/2005 | Wantanabe et al. |
| 2005/0173569 A1 | 8/2005 | Noorbakhsh et al. |
| 2005/0241583 A1 | 11/2005 | Buechel et al. |
| 2006/0054090 A1 | 3/2006 | Kurita et al. |
| 2006/0240542 A1 | 10/2006 | Schieve et al. |
| 2006/0240680 A1 | 10/2006 | Yokota et al. |
| 2008/0041311 A1 | 2/2008 | Nakashima et al. |
| 2008/0081114 A1 | 4/2008 | Johanson et al. |
| 2008/0185018 A1 | 8/2008 | Mimken et al. |
| 2010/0043888 A1 | 2/2010 | Sneh |
| 2010/0136773 A1 | 6/2010 | Naonori et al. |
| 2011/0236599 A1 | 9/2011 | Furuta et al. |
| 2012/0225195 A1 | 9/2012 | Yudovsky |
| 2012/0225206 A1 | 9/2012 | Yudovsky |
| 2013/0019907 A1 | 1/2013 | Avoyan et al. |
| 2013/0019960 A1 | 1/2013 | Choi et al. |
| 2013/0237058 A1 | 9/2013 | Masuda |
| 2013/0315795 A1 | 11/2013 | Bera et al. |
| 2014/0216577 A1 | 8/2014 | Huang et al. |
| 2015/0107772 A1 | 4/2015 | Uchida |
| 2015/0211124 A1 | 7/2015 | Nozawa et al. |

FOREIGN PATENT DOCUMENTS

| | | |
|---|---|---|
| JP | 2013169627 A | 9/2013 |
| KR | 1020050005074 A | 7/2005 |
| KR | 1020060084345 A | 7/2006 |
| KR | 100699861 B1 | 3/2007 |

RECURSIVE INJECT APPARATUS FOR IMPROVED DISTRIBUTION OF GAS

CROSS-REFERENCE TO RELATED APPLICATIONS

This application claims priority to U.S. application Ser. No. 15/192,159, filed Jun. 24, 2016, now U.S. Pat. No. 10,633,741, issued Apr. 28, 2020, which claims priority to U.S. Provisional Application No. 62/185,554, filed Jun. 26, 2015, the entire disclosures of which are hereby incorporated by reference herein.

TECHNICAL FIELD

Embodiments of the present disclosure relate generally to apparatus and methods for depositing thin films. In particular, embodiments of the disclosure are directed to gas injector unit inserts and gas injector units using the inserts.

BACKGROUND

Semiconductor device formation is commonly conducted in substrate processing systems or platforms containing multiple chambers, which may also be referred to as cluster tools. In some instances, the purpose of a multi-chamber processing platform or cluster tool is to perform two or more processes on a substrate sequentially in a controlled environment. In other instances, however, a multiple chamber processing platform may only perform a single processing step on substrates. The additional chambers can be employed to maximize the rate at which substrates are processed. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

The concept of spatial ALD is based on a clear separation of different gas phase reactive chemicals. Mixing of the chemicals is prevented to avoid gas phase reactions. The general design of a spatial ALD chamber may include a small gap between susceptor (or wafer surface) and gas injector. This gap can be in the range of about 0.5 mm to about 2.5 mm. Vacuum pumping channels are positioned around each chemical showerhead. Inert gas purge channels are between the chemical showerheads to minimize gas phase mixing. While current injector designs are able to prevent gas phase mixing the reactive species, the injectors do not provide enough control over where and when precursor exposure happens. There is an ongoing need in the art for apparatus and methods for controlling the flow of gases into a processing chamber.

In existing designs, as the precursor (or gas) begins to flow into the injector, the gas starts by charging the center of the injector and working outwards along the face of an injector plenum. When the injector is fully charged at steady state, precursor distribution is relatively uniform. Until the injector is fully charged, a large gas distribution non-uniformity exists. There is a need in the art for apparatus and methods to rapidly change gases in an injector while minimizing the amount of time to reach steady state gas distribution.

SUMMARY

One or more embodiments of the disclosure are directed to injector unit inserts comprising a first insert component, a second insert component and a third insert component. The first insert component has a gas inlet line. The second insert component includes a channel sized to hold the first insert component in an upper portion of the channel and maintain a flow path in a lower portion of the channel. The channel forms a flow path first arm in fluid communication with the gas inlet line. The first arm splits a gas flow into two flow paths. Each flow path splits at a second arm into two flow paths and each end of the second arms has a hole extending through the second insert component The third insert component has a top surface including a plurality of recesses so that when a bottom surface of the second insert component is against the top surface of the third insert component, the plurality of recesses form a plurality of channels. Each of the plurality of channels is aligned to form fluid communication with a gas flowing through the holes in the second insert component.

Additional embodiments of the disclosure are directed to injector unit inserts comprising a gas inlet line. A first arm is in fluid communication with the gas inlet line. Two first legs are in fluid communication with the first arm. A second arm is in fluid communication with each of the first legs. Two second legs are in fluid communication with each of the second arms. A third arm is in fluid communication with each of the second legs. Two third legs are in fluid communication with each of the third arms.

Further embodiments of the disclosure are directed to injector units comprising an injector body with a back face and front face. An injector unit insert as described herein is positioned in the injector body. A first plenum is adjacent a bottom face of the injector unit insert. A plurality of channels extends from the first plenum toward the front face of the injector body. The plurality of channels is in fluid communication with the first plenum. A gas port is in the front face of the injector body and is in fluid communication with the plurality of channels.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways. It is also to be understood that the complexes and ligands of the present disclosure may be illustrated herein using structural formulas which have a particular stereochemistry. These illustrations are intended as examples only and are not to be construed as limiting the disclosed structure to any particular stereochemistry. Rather, the illustrated structures are intended to encompass all such complexes and ligands having the indicated chemical formula.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

Figure 1:
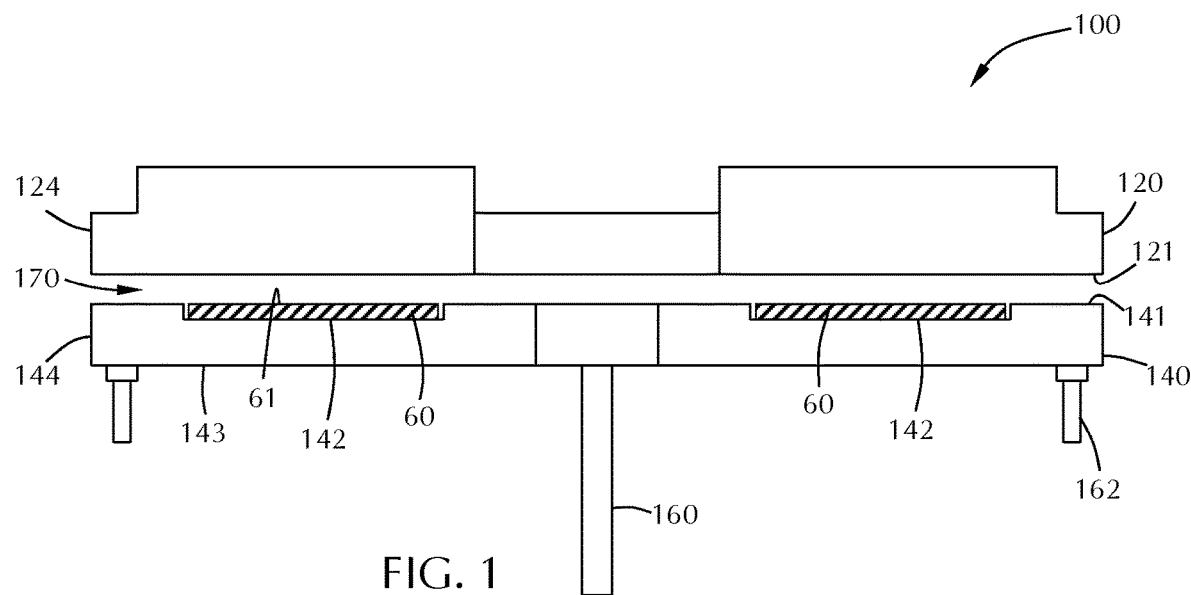
FIG. 1 shows a cross-sectional view of a batch processing chamber in accordance with one or more embodiment of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of gas channels. The plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
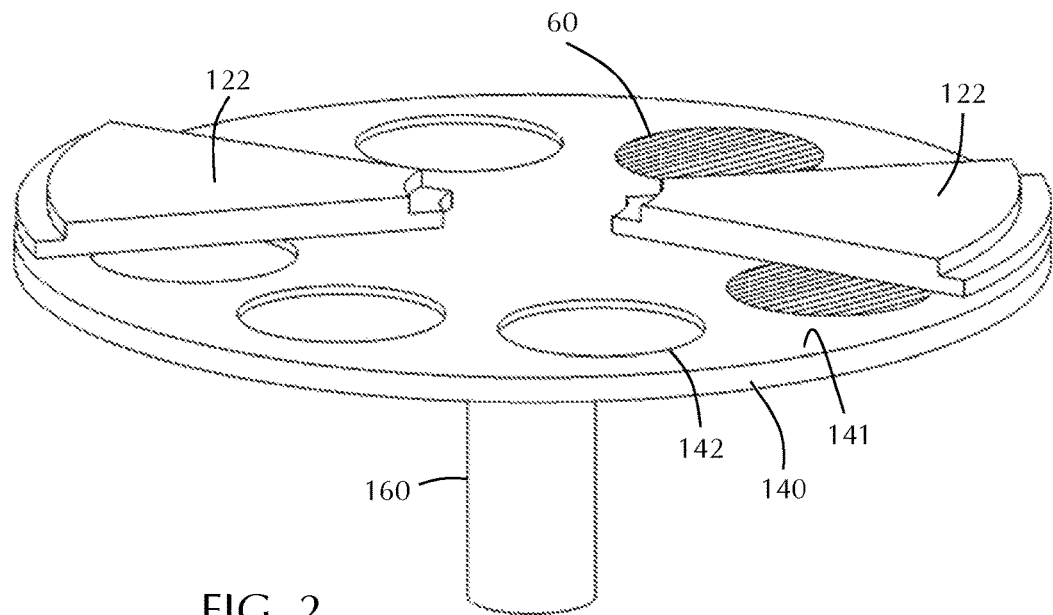
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
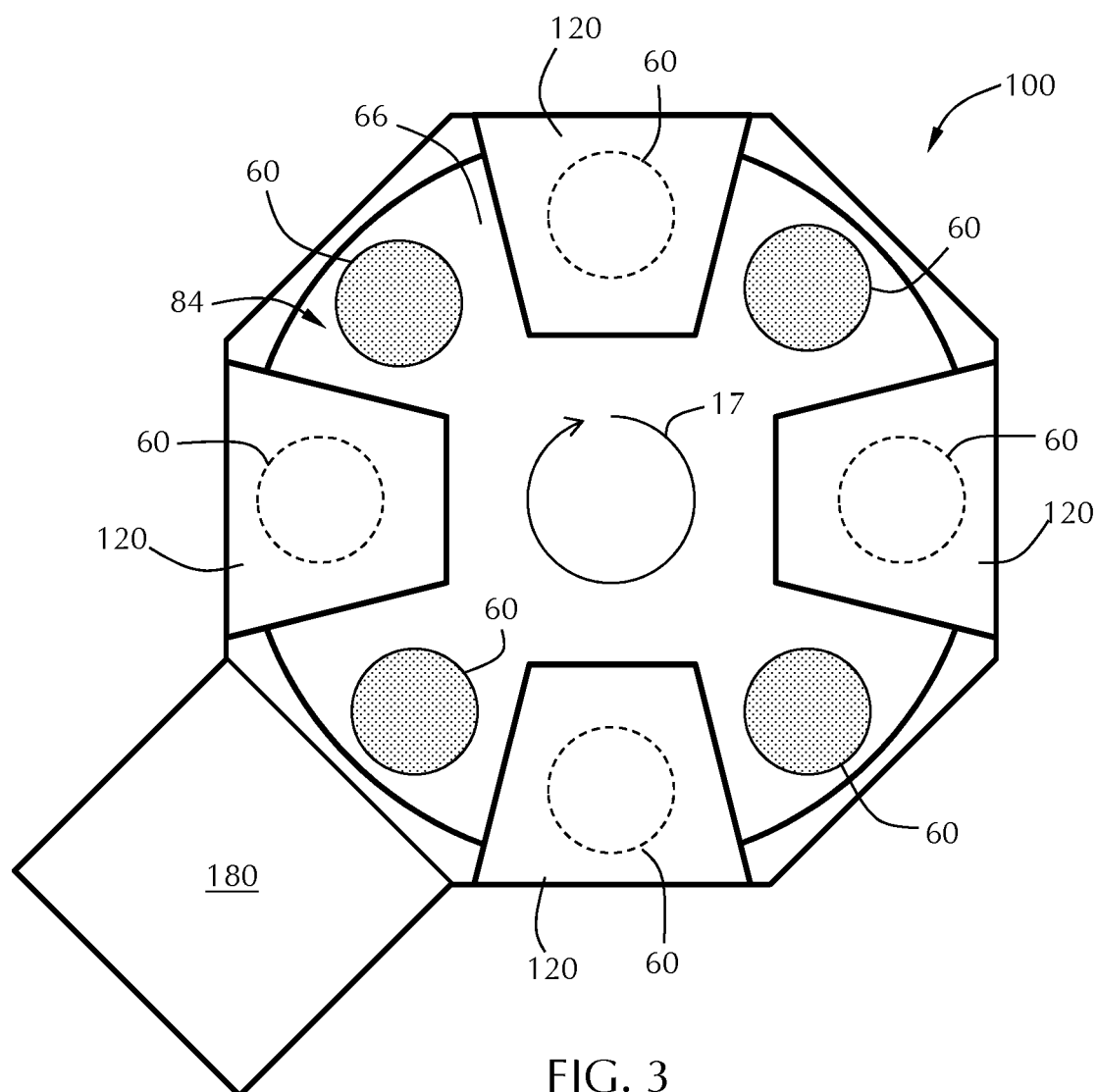
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the gas distribution assemblies 120. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the gas distribution assemblies 120. With spatial ALD injectors, a film is deposited on the wafer during movement of the wafer relative to the injector assembly. In some embodiments, the susceptor assembly 140 is rotated in increments that prevent the substrates 60 from stopping beneath the gas distribution assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies) evenly spaced about the processing chamber 100. The processing chamber 100 shown is octagonal, however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
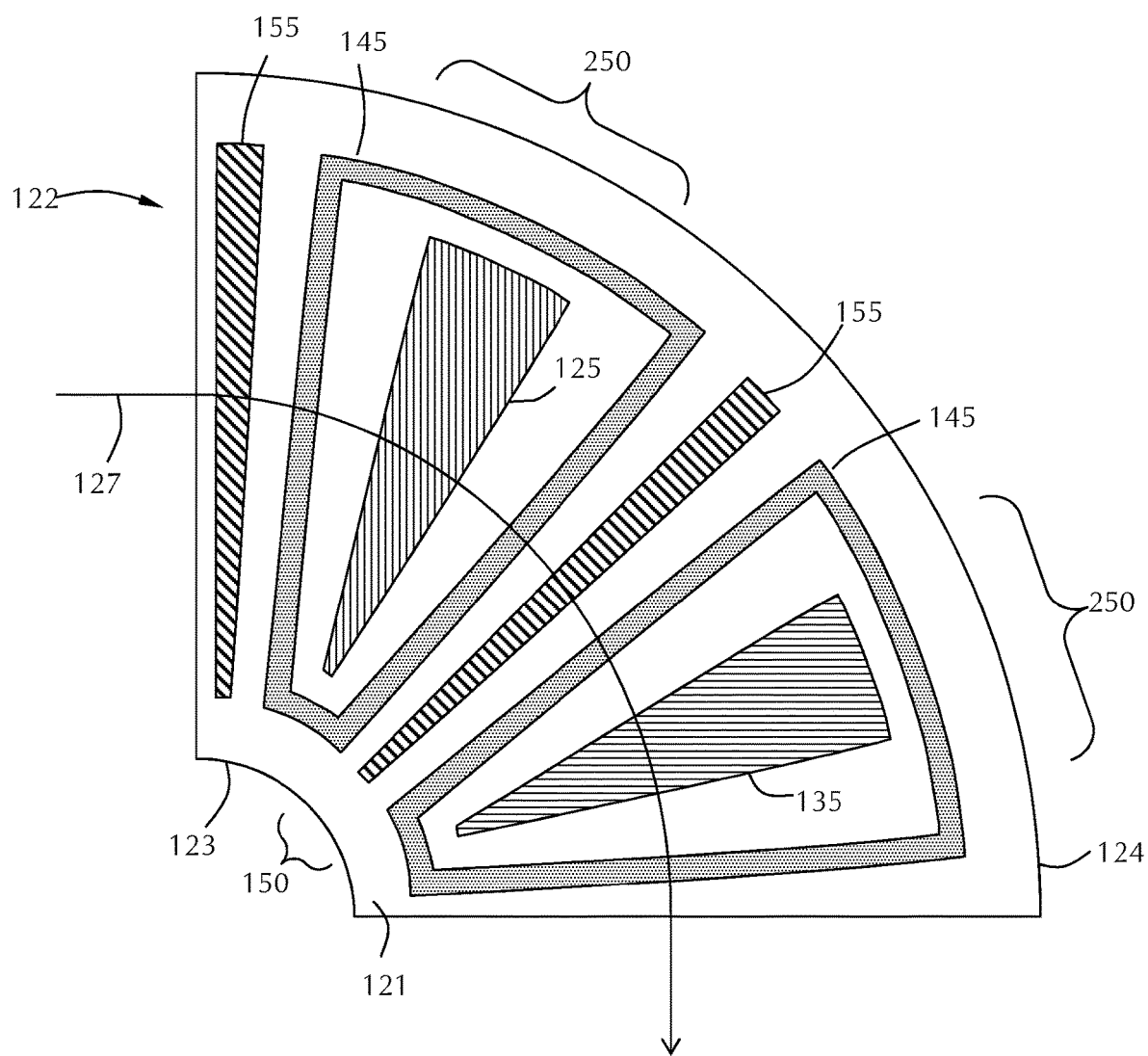
FIG. 4 shows a schematic view of a portion of a wedge shaped gas distribution assembly for use in a batch processing chamber in accordance with one or more embodiment of the disclosure.
Figure 5:
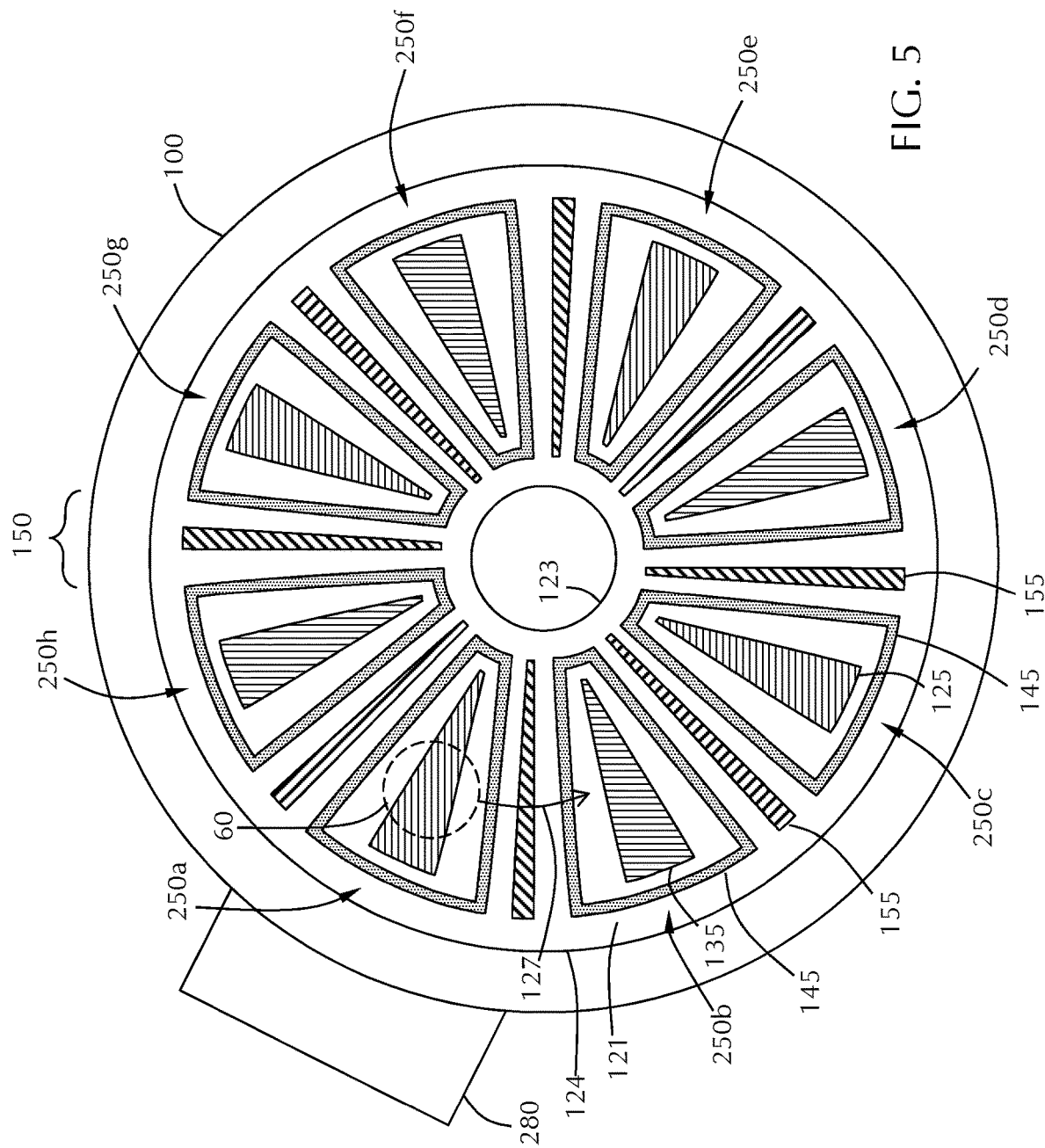
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and vacuum ports 145 in a front surface 121 of the gas distribution assembly 220. The plurality of elongate gas ports 125, 135, 155 and vacuum ports 145 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to gas streams from the first reactive gas port 125 and the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120 (also referred to as a gas distribution plate). The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150*a*, 150*b*. Rotating the substrate 60 along path 127 will move the substrate counterclockwise around the processing chamber 100. Thus, the substrate 60 will be exposed to the first processing region 250*a* through the eighth processing region 250*h*, including all processing regions between. For each cycle around the processing chamber, using the gas distribution assembly shown, the substrate 60 will be exposed to four ALD cycles of first reactive gas and second reactive gas.

The conventional ALD sequence in a batch processor, like that of FIG. 5, maintains chemical A and B flow respectively from spatially separated injectors with pump/purge section between. The conventional ALD sequence has a starting and ending pattern which might result in non-uniformity of the deposited film. The inventors have surprisingly discovered that a time based ALD process performed in a spatial ALD batch processing chamber provides a film with higher uniformity. The basic process of exposure to gas A, no reactive gas, gas B, no reactive gas would be to sweep the substrate under the injectors to saturate the surface with chemical A and B respectively to avoid having a starting and ending pattern form in the film. The inventors have surprisingly found that the time based approach is especially beneficial when the target film thickness is thin (e.g., less than 20 ALD cycles), where starting and ending pattern have a significant impact on the within wafer uniformity performance. The inventors have also discovered that the reaction process to create SiCN, SiCO and SiCON films, as described herein, could not be accomplished with a time-domain process. The amount of time used to purge the processing chamber results in the stripping of material from the substrate surface. The stripping does not happen with the spatial ALD process described because the time under the gas curtain is short.

Accordingly, embodiments of the disclosure are directed to processing methods comprising a processing chamber 100 with a plurality of processing regions 250*a*-250*h* with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250*a*-250*h*. The number of gas curtains is generally equal to or greater than the number of processing regions. For example, if region 250*a* had no reactive gas flow, but merely served as a loading area, the processing chamber would have seven processing regions and eight gas curtains.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250*b* through processing region 250*h*, an inert gas would be flowing into processing region 250*a*. The inert gas can be flowed through the first reactive gas port 125 or the second reactive gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Some embodiments of the disclosure are directed to injector modules. While the injector modules are described with respect to a spatial ALD processing chamber, those skilled in the art will understand that the modules are not limited to spatial ALD chambers and can be applicable to any injector situation where increasing gas flow uniformity is useful.

Injector modules are an assembly of parts used to distribute precursor/process gases over the wafer or substrate surface in the processing chamber. In the spatial ALD chamber described, precursor gas flows substantially vertically from an injector stack, through the injector, and through the bottom of the injector towards the top face of the wafer. The injector often comprises an injector plenum/volume, followed by a plurality of holes in a rectangular (or other) pattern, which flow into another (second) plenum as defined by the geometry of a showerhead, and finally through another plurality of holes in the showerhead. Prior to entering the injector stack and the first injector plenum, the precursor gas is flowing through a series of gasline weldments which ultimately ends at one injector hole into the injector plenum. This entry hole/point is located at the center of the injector plenum. The transition from the entry point to the injector plenum causes uneven distribution of precursor gas across the entire injector and showerhead during the beginning of precursor flow. As the precursor begins to flow into the injector, it starts by charging the center and works outwards along the face of the injector plenum. When the injector is fully charged at steady state, precursor distribution is not an issue because the back pressure on the injector is high enough to force equal distribution. However, considering the transition at the start of flowing precursor, a large precursor distribution non-uniformity results. In some injectors, precursor non-uniformity is observed even after 0.75 seconds as the precursor has not fully concentrated the entire injector plenum area.

In the spatial ALD processing chamber described, the top surface of the wafer is very close to the bottom surface of the injectors. The deposition is very susceptible to being effected by uneven precursor distribution coming from the injector. In conventional injectors, the wafer would rotate/pass under the injector and sweep under the distribution of precursor coming from the injector shower head. At the beginning of the process, the wafer would see a central-heavy precursor concentration. Due to the fast growing nature of many processes, the reaction beginning at the center of the wafer during the first layer of growth causes overall thickness to be outside acceptable thickness non-uniformity specifications. Such specification can be, for example, less than 0.8 Å. The gas flow uniformity can be an issue in both charging and purging the injectors. Purging the injector presents the opposite scenario to charging the injector where the precursor at the outer edges of the injector take longer to be purged Shortening the time of transition between uneven gas distributions to a fully charged, fully distributed flow can impact process uniformity. If the precursor could be fully distributed evenly across the injector plenum immediately at the beginning of the process, then the precursor concentration across the wafer would be immediately uniform, and the process reaction would be uniform. Embodiments of the disclosure mechanically force the precursor gas to evenly distribute across the injector plenum in a way that has not been done before. This can significantly reduce the time (~5x) for the injector to be fully charged/concentrated with precursor gas. Some embodiments of the disclosure comprise a metal insert that is placed within the first injector plenum and creates a mechanical pathway transition between the central entry point and the plurality of patterned holes in the injector body. The metal insert may be referred to as a "recursive inject insert." In some embodiments, the recursive inject insert forces the entering precursor to split equally along two injector path arms/legs. Each leg is then split twice to have a total of 4 legs. Each of the four legs are then split again, each twice, to have a total of 8 legs. Each of the 8 legs can be split evenly to end with 16 evenly distributed legs. The inject path, from the central entry to the exit of each of the 16 legs, is substantially equal for all 16 legs. In other words, the path of gas (length, number of bends) is substantially equal for all legs one through 16. The total number of legs or splits can be varied. For example, each leg can be split into 3, 4, 5, 6 or more legs. Without being bound by any particular theory of operation, it is believed that a configuration of this type will force the precursor gas to be evenly concentrated along the length of the injector plenum at any time during the precursor flow. This means that the first injector plenum is not exposed to any precursor prior to having all 16 legs fully charged with precursor gas concentration.

The same characteristics of the disclosure apply to purging the precursor gas out of the injector at the end of the process step. Purging the precursor evenly and immediately with a purge gas (e.g., $N_2$) when the precursor replaces the purge gas in the plenum can be useful. The two cases (charging and purging) are the reverse of each other and both problems are solved by embodiments of the disclosure.

Figure 6:
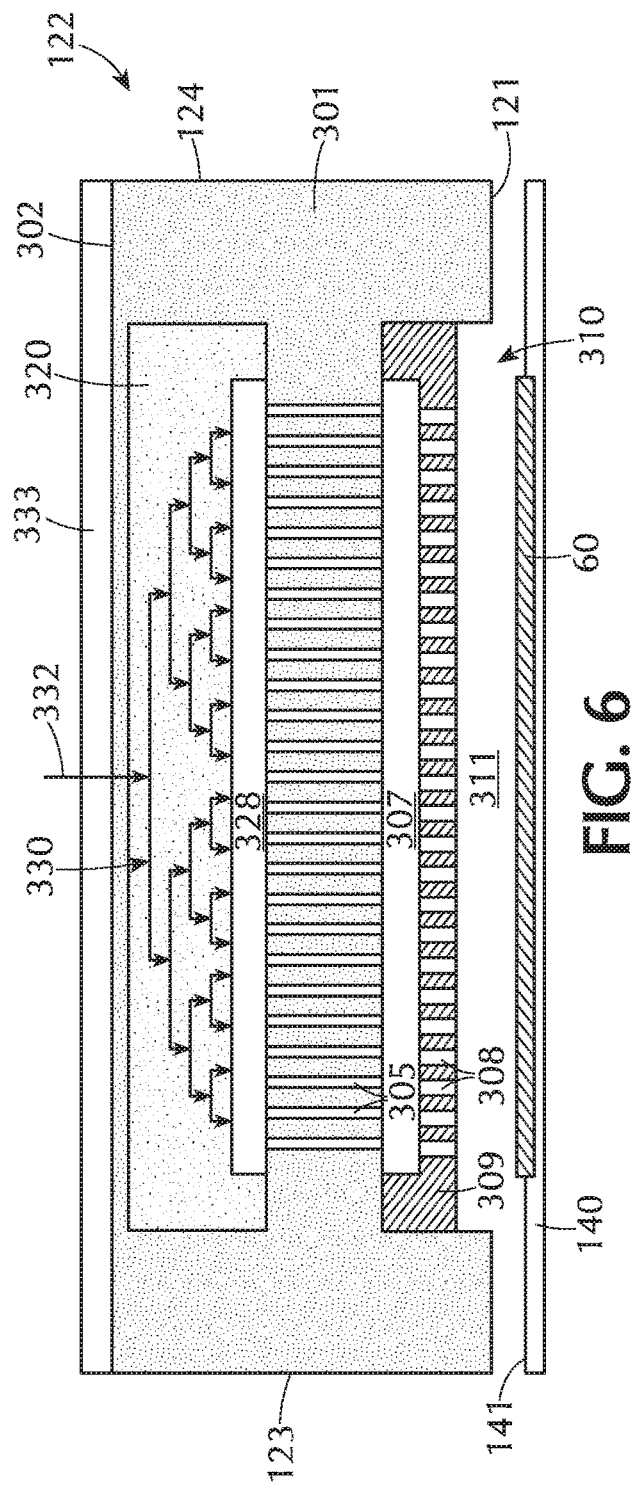
FIG. 6 shows a cross-sectional schematic of a gas injector unit in accordance with one or more embodiments of the disclosure.

FIG. 6 shows a cross-sectional view of an injector unit 122 in accordance with one or more embodiments of the disclosure. The injector unit includes an injector body 301 with a back face 302, front surface 121, inner peripheral edge 123 and outer peripheral edge 124. The embodiment is described relative to a wedge-shaped injector unit, but those skilled in the art will understand that the disclosure is not limited to wedge-shaped injectors. The inner and outer peripheral edges could be the same size so that the injector is square or rectangular shaped. The front surface 121 of the injector unit 122 includes a gas port 310 through which a gas can flow toward the top surface of the substrate 60 or the top surface 141 of the susceptor 140.

Figure 7:
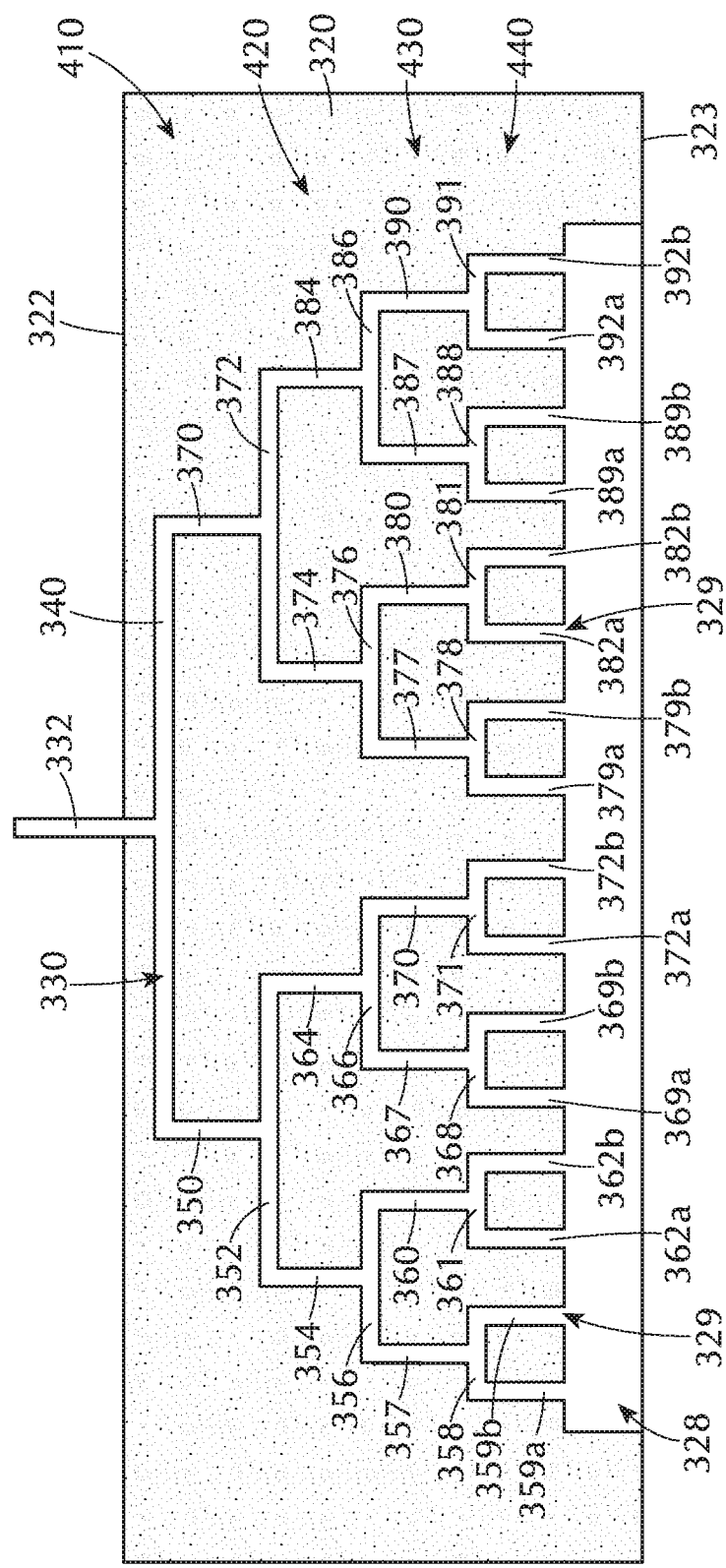
FIG. 7 shows a cross-sectional schematic of a gas injector unit insert in accordance with one or more embodiments of the disclosure.

A gas inlet line 332 connects through the back face 302 of the injector unit 122 to an injector insert 320. In the embodiment shown, the gas inlet line 332 passes through a heater/cooler plate 333 positioned adjacent the back face 302 of the injector body. The gas inlet line 332 can be, for example, a standard gas line connection that can be connected to a gas source (e.g., gas cylinder or ampoule system). The injector insert 320 has a gas flow path 330 extending from a top face 322 to the bottom face 323 of the injector insert 320. An injector insert according to one or more embodiments is shown in FIGS. 6 and 7 in cross-section. While the embodiments shown have two legs connected to each arm in the flow path, those skilled in the art will understand that a three-dimensional component can have more than two legs connected to each horizontal arm.

The gas inlet line 332 connects to and is in fluid communication with a first arm 340. For descriptive purposes, the term "arm" is used to describe a portion of the flow path 330 that extends horizontally and the term "leg" is used to describe a portion of the flow path 330 that extends vertically. In a first flow path level 410, the first arm 340 is connected to and in fluid communication with first leg 350 and first leg 370. Each flow path level refers to a combination of horizontal and vertical connections that splits the gas flow. The first leg 350 is connected to and in fluid communication with second arm 352 and first leg 370 is connected to and in fluid communication with second arm 372.

In a second flow path level 420, the second arm 352 is connected to and in fluid communication with second leg 354 and second leg 364. The second arm 372 is connected to and in fluid communication with second leg 374 and second leg 384. The second leg 354 is connected to and in fluid communication with third arm 356. Second leg 364 is connected to and in fluid communication with third arm 366. Second leg 374 is connected to and in fluid communication with third arm 376. Second leg 384 is connected to and in fluid communication with third arm 386.

In a third flow path level 430, third arm 356 is connected to and in fluid communication with third leg 357 and third leg 360. Third arm 366 is connected to and in fluid communication with third leg 367 and third leg 370. Third arm 376 is connected to and in fluid communication with third leg 377 and third leg 380. Third arm 386 is connected to and in fluid communication with third leg 387 and third leg 390. Third leg 357 is connected to and in fluid communication with fourth arm 358. Third leg 360 is connected to and in fluid communication with fourth arm 361. Third leg 367 is connected to and in fluid communication with fourth arm 368. Third leg 370 is connected to and in fluid communication with fourth arm 371. Third leg 377 is connected to and in fluid communication with fourth arm 378. Third leg 380 is connected to and in fluid communication with fourth arm 381. Third leg 387 is connected to and in fluid communication with fourth arm 388. Third leg 390 is connected to and in fluid communication with fourth arm 391.

In a fourth flow path level 440, fourth arm 358 is connected to and in fluid communication with fourth leg 359a and fourth leg 359b. Fourth arm 361 is connected to and in fluid communication with fourth leg 362a and fourth leg 362b. Fourth arm 368 is connected to and in fluid communication with fourth leg 369a and fourth leg 369b. Fourth arm 371 is connected to and in fluid communication with fourth leg 372a and fourth leg 372b. Fourth arm 378 is connected to and in fluid communication with fourth leg 379a and fourth leg 379b. Fourth arm 381 is connected to and in fluid communication with fourth leg 382a and fourth leg 382b. Fourth arm 388 is connected to and in fluid communication with fourth leg 389a and fourth leg 389b. Fourth arm 391 is connected to and in fluid communication with fourth leg 392a and fourth leg 392b.

Each of the fourth legs ends with an opening 329 leading to a first plenum 328. The first plenum 328 is a region where the gases flowing through each of the fourth legs are re-combined into a single region. The first plenum 328 is shown as a portion of the injector insert 320. Those skilled in the art will understand that the first plenum 328 can be outside of the injector insert 320, depending on the arrangement and shape of the components within the injector unit 122.

The number of flow path levels can be varied depending on, for example, the size of the injector unit 122 and the number of final openings 329 into the plenum 328. Where each arm splits into two legs, the number of openings 329 are a power of 2. For example, four flow path levels like that of FIG. 7) will have $2^4$ (or 16) openings.

The flow path for each individual opening 329 is defined as the length of the path from the inlet to the opening 329. In some embodiments, each of the flow paths has substantially the same length. As used in this specification and the appended claims, the term "substantially the same length" means that the overall length of the flow paths is greater than or equal to about 95% of the average flow path length for all of the flow paths. In some embodiments, the a gas flowing through each of the individual flow paths has substantially the same residence time and/or substantially the same conductance as gas flowing through the other flow paths. As used in this specification and the appended claims, the term "substantially the same residence time" means the residence time of any individual flow path is greater than or equal to about 95% of the average residence time for all flow paths. As used in this specification and the appended claims, the term "substantially the same conductance" means the conductance of any individual flow path is greater than or equal to about 95% of the average conductance for all flow paths.

In some embodiments, the conductance of one or more of the flow paths are different than the conductance of the other flow paths. Such an arrangement would intentionally introduce a non-uniformity into the flow which may be useful in oddly shaped plenums.

Referring back to FIG. 6, after gas charges plenum 328, a steady state is reached because the back pressure in the plenum 328 may be greater than the flow conductance through channels 305 into second plenum 307. Gas charging second plenum 307 will also reach steady state because the back pressure in the second plenum 307 may be greater than the conductance through channels 308 in showerhead 309 to the process region 311.

Figure 8:
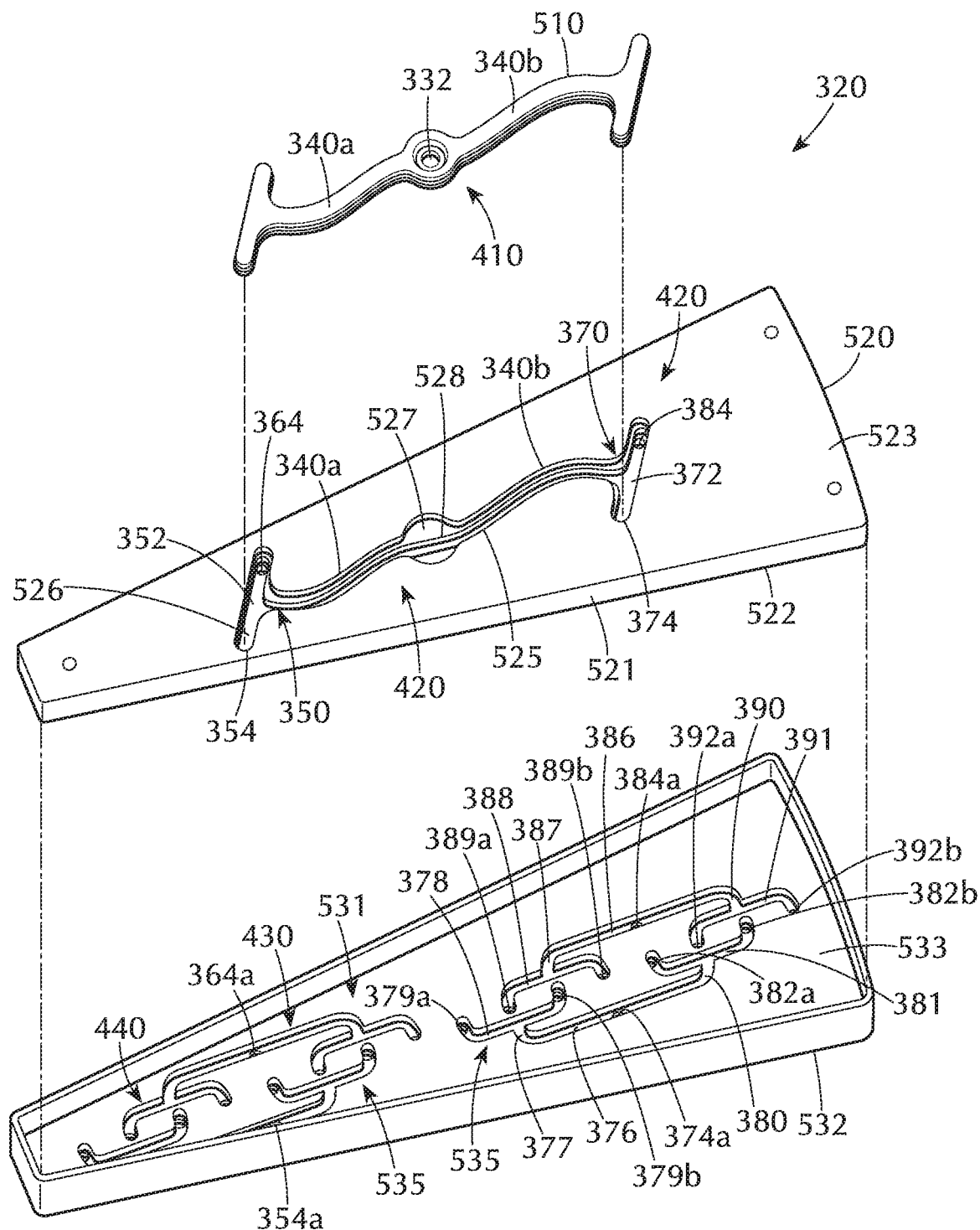
FIG. 8 shows an exploded perspective view of a gas injector unit insert in accordance with one or more embodiments of the disclosure.

FIG. 8 shows an embodiment of an injector insert 320 in accordance with one or more embodiment of the disclosure in which a multi-component structure splits a single inlet line into sixteen identical outlets. The injector insert 320 shown comprises three components which fit together like a puzzle to form three flow path levels. A first insert component 510 has a gas inlet line 332 in fluid communication with a first arm 340. Gas flowing through the gas inlet line 332 is split into equal flows along both sides of the first arm 340a, 340b.

The first insert component 510 shown can fit into a channel 525 formed in the top surface 523 of the second insert component 520. The channel 525 can be any suitable depth, length or shape depending on, for example, the thickness, length or shape of the first insert component 510. The channel 525 shown has a lower portion 526 and an upper portion 527 with a ledge 528. The first insert component 510 can fit into the upper portion 527 of the channel 525 and rest on the ledge 528. In this position, the first insert component 510 and second insert component 520 seal the lower portion 526 of the channel 525 to create the flow path.

Both first arm 340a and first arm 340b form symmetrical paths having equivalent lengths and geometries. In the embodiment shown, every twist and turn of first arm 340a has a substantially equivalent twist or turn in first arm 340b so that a gas flowing from inlet 332 will have substantially equivalent paths at first leg 350 and first leg 370. As used in this specification and the appended claims, the term "substantially equivalent twist or turn," and the like, used to describe a flow path means that the angles, lengths and corners are the same within ±5% based on the measurement (e.g., angle, length). As used in this specification and the appended claims, the term "substantially equivalent paths," and the like, means that the paths being compared have substantially equivalent twists and/or turns.

First legs 350, 370 in the embodiment shown are relatively short length regions immediately adjacent the splits into second arm 352 and second arm 372. The first leg 350 splits into second arm 352 at a substantially right angle so that the flow toward second leg 354 and second leg 364 has substantially equivalent paths. As used in this specification and the appended claims, the term "substantially right angle," and the like, means that the angle is in the range of about 85° to about 95°. Similarly, the first leg 370 splits into second arm 372 at a substantially right angle so that the flow toward second leg 374 and second leg 384 are substantially equivalent paths. The second insert component 520 shown includes the equivalent structure for the second flow path 420 shown in FIG. 7.

Second leg 354, 364, 374, 384 are shown as holes extending through the thickness of the body 521 of the second insert component 520. The thickness of the body 521 can depend on, for example, the size of the component and the depth of the channel 525.

The second insert component 520 shown fits into a recess 531 in a third insert component 530. The bottom surface 522 of second insert component 520 can form a seal with the top surface 533 of the third insert component 530. The seal isolates the plurality of channels 535 formed in the top surface 533 of the third insert component 530.

The third flow path level 430 and fourth flow path level 440 have equivalents in the channels 535 of the third insert component 530. The second leg 354, 364, 374, 384 align with the center of the third arms 356, 366, 376, 386. The alignment points for leg 354, 364, 374, 384 are marked as 354a, 364a, 374a, 384a, respectively. For ease of description, the flow paths from third arms 376, 386 are further described. Those skilled in the art will understand that the flow paths from third arms 356, 366 are not labeled in FIG. 8 because of space constraints only.

The third arm 376 turns to the third leg 377 and third leg 380. Third leg 377 intersects fourth arm 378 at a substantially right angle and third leg 380 intersects fourth arm 381 at a substantially right angle. Fourth arm 378 equivalently splits flow into fourth leg 379a, 379b and fourth arm 381 equivalently splits flow into fourth leg 382a, 382b.

Additionally, the third arm 386 turns to the third leg 387 and third leg 390. Third leg 387 intersects fourth arm 388 at a substantially right angle and third leg 390 intersects fourth arm 391 at a substantially right angle. Fourth arm 388 equivalently splits flow into fourth leg 389a, 389b and fourth arm 391 equivalently splits flow into fourth leg 392a, 392b. Fourth legs 379a, 379b, 382a, 382b, 389a, 389b, 392a, 392b are shown as holes extending through the thickness of the third insert component 530.

Figure 9:
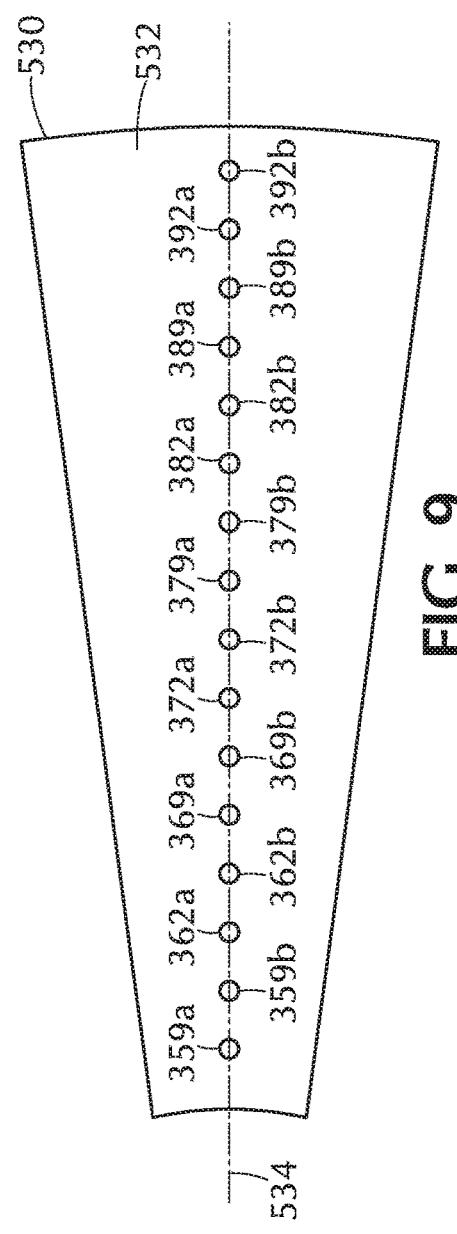
FIG. 9 shows a front face of the gas injector unit insert of FIG. 8.

FIG. 9 shows the bottom surface 532 of the third insert component 530 from the perspective of the first plenum 328. The fourth legs 379a, 379b, 382a, 382b, 389a, 389b, 392a, 392b end as openings 329 in the bottom surface 532. The openings 329 are shown equidistant from each other and aligned along the center line 534 of the third insert component 530. As used in this specification and the appended claims, the term "equidistant" used in this regard means that the distance between any given hole and an adjacent hole is greater than or equal to about 95% of the average distance between all of the holes. In some embodiments, the plurality of openings 329 is not aligned along the center line 534. In some embodiments, the plurality of openings 329 is not equidistant.

A comparison of the transient precursor concentration between a baseline injector (a single gas inlet leading to a first plenum) and the recursive injector (as shown in FIG. 8) showed that the injector volume of the recursive injector was almost completely charged at 0.25 seconds, whereas the baseline injector showed a clear center-heavy concentration of precursor at this time. Aluminum oxide films were deposited in the spatial ALD processing chamber shown in FIG. 5 using trimethylaluminum and water. With a baseline injector, film thickness ranged from 0.76 to 1.07 Å. When the same film was deposited with a recursive injector like that shown in FIG. 8, the film thickness range dropped to 0.53 to 0.61 Å improving uniformity for a batch of five wafers with an average thickness of about 40 Å.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing chamber comprising:
    a gas distribution assembly having a top surface and a bottom surface and comprising a plurality of injector units, each injector unit comprising:
        a first insert component having a gas inlet line;
        a second insert component including a channel sized to hold the first insert component in an upper portion of the channel and maintain a flow path in a lower portion of the channel, the channel forming a flow path in a first arm in fluid communication with the gas inlet line, the first arm splitting a gas flow into two flow paths in two first legs, each first leg splitting at a second arm into two flow paths, each end of the second arms having a hole extending through the second insert component; and
        a third insert component having a top surface and a bottom surface, the top surface including a plurality of recesses so that when a bottom surface of the second insert component is against the top surface of the third insert component, the plurality of recesses form a plurality of channels, each of the plurality of channels aligned to form fluid communication with a gas flowing through the holes in the second insert component; and
    a susceptor assembly comprising a susceptor with a top surface facing the bottom surface of the gas distribution assembly, a distance between the bottom surface of the gas distribution assembly and the top surface of the susceptor defining a gap.

2. The processing chamber of claim 1, wherein the susceptor comprises at least one recess within the top surface.

3. The processing chamber of claim 2, wherein the at least one recess is sized so that a substrate supported in the at least one recess has a top surface substantially coplanar with the top surface of the susceptor.

4. The processing chamber of claim 1, wherein the susceptor assembly further comprises a support post configured to lift, lower and/or rotate the susceptor assembly.

5. The processing chamber of claim 1, further comprising an auxiliary chamber.

6. The processing chamber of claim 5, further comprising a wafer robot configured to move a substrate from the auxiliary chamber to the susceptor.

7. The processing chamber of claim 1, wherein the gas distribution assembly further comprises at least one vacuum channel.

8. The processing chamber of claim 1, wherein each channel in the third insert component comprises a third arm in fluid communication with the hole in the second insert component, each third arm splitting a flow path into two third legs on either end of the third arm, and each third leg connects to and is in fluid communication with a fourth arm, and each fourth arm splits a flow path into two fourth legs.

9. The processing chamber of claim 8, wherein each fourth leg extends through a thickness of the third insert component and forms an opening in the bottom surface of the third insert component.

10. The processing chamber of claim 9, wherein each opening in the third insert component is in fluid communication with the gas line inlet and forms a flow path, each flow path has substantially the same residence time, conductance and/or length.

11. The processing chamber of claim 1, wherein each junction between a leg and arm occurs at a substantially right angle.

12. The processing chamber of claim 1, wherein each first leg connects to a center of each second arm.

13. The processing chamber of claim 1, wherein openings in the bottom surface of the third insert component are substantially equidistant.

14. The processing chamber of claim 1, wherein openings in the bottom surface of the third insert component are aligned along a center line of the bottom surface.

15. A processing chamber comprising:
a gas distribution assembly comprising a plurality of injector units, each injector unit comprising:
an injector body having a back face and front surface;
an injector unit insert positioned in the injector body, the injector unit insert comprising:
a first insert component having a gas inlet line;
a second insert component including a channel sized to hold the first insert component in an upper portion of the channel and maintain a flow path in a lower portion of the channel, the channel forming a flow path in a first arm in fluid communication with the gas inlet line, the first arm splitting a gas flow into two flow paths in two first legs, each first leg splitting at a second arm into two flow paths, each end of the second arms having a hole extending through the second insert component; and
a third insert component having a top surface and a bottom surface, the top surface including a plurality of recesses so that when a bottom surface of the second insert component is against the top surface of the third insert component, the plurality of recesses form a plurality of channels, each of the plurality of channels aligned to form fluid communication with a gas flowing through the holes in the second insert component;
a first plenum adjacent a bottom face of the injector unit insert;
a plurality of plenum channels extending from the first plenum toward the front surface of the injector body, the plurality of channels in fluid communication with the first plenum; and
a gas port in the front surface of the injector body, the gas port in fluid communication with the plurality of channels; and
a susceptor assembly comprising a susceptor with a top surface facing the bottom surface of the gas distribution assembly, a distance between the bottom surface of the gas distribution assembly and the top surface of the susceptor defining a gap.

16. The processing chamber of claim 15, further comprising a showerhead positioned within the gas port and in fluid communication with the plurality of plenum channels.

17. The processing chamber of claim 16, further comprising a second plenum between the plurality of plenum channels and the showerhead.

18. The processing chamber of claim 16, wherein the injector unit is wedge shaped.

* * * * *